United States Patent
Hong et al.

(10) Patent No.: US 8,638,251 B1
(45) Date of Patent: Jan. 28, 2014

(54) DELAY COMPENSATION FOR SIGMA DELTA MODULATOR

(75) Inventors: Merit Hong, Chandler, AZ (US); James Riches, Chandler, AZ (US)

(73) Assignee: McAfee, Inc., Santa Clara, CA (US)

( * ) Notice: Subject to any disclaimer, the term of this patent is extended or adjusted under 35 U.S.C. 154(b) by 0 days.

(21) Appl. No.: 13/598,412

(22) Filed: Aug. 29, 2012

(51) Int. Cl.
 *H03M 3/00* (2006.01)

(52) U.S. Cl.
 USPC ........... 341/143; 341/144; 341/155; 327/295; 327/165; 327/297; 327/296; 327/294; 713/400

(58) Field of Classification Search
 USPC .......... 341/143–160; 327/165, 295, 291, 297, 327/298; 713/400
 See application file for complete search history.

(56) References Cited

U.S. PATENT DOCUMENTS

| | | | |
|---|---|---|---|
| 5,964,708 A * | 10/1999 | Freeman et al. | 600/447 |
| 6,208,189 B1 * | 3/2001 | Freeman et al. | 327/277 |
| 6,867,720 B1 * | 3/2005 | Freeman et al. | 341/143 |
| 6,891,148 B1 * | 5/2005 | Rivera et al. | 250/221 |
| 6,943,610 B2 * | 9/2005 | Saint-Laurent | 327/295 |
| 6,987,474 B2 * | 1/2006 | Freeman et al. | 341/143 |
| 7,242,336 B1 | 7/2007 | Jensen | |
| 7,317,342 B2 * | 1/2008 | Saint-Laurent | 327/295 |
| 7,321,325 B2 * | 1/2008 | Hsieh et al. | 341/143 |
| 7,405,687 B2 | 7/2008 | Mitteregger et al. | |
| 7,408,494 B2 | 8/2008 | Mitteregger | |
| 7,411,534 B1 | 8/2008 | Melanson | |
| 7,432,840 B2 | 10/2008 | Doerrer et al. | |
| 7,495,593 B2 | 2/2009 | Wang | |
| 7,511,652 B1 | 3/2009 | Liu et al. | |
| 7,535,392 B2 | 5/2009 | Weng et al. | |
| 7,554,474 B2 | 6/2009 | Le Guillou | |
| 7,616,142 B1 | 11/2009 | Mai | |
| 7,928,878 B1 | 4/2011 | Coban et al. | |
| 7,982,647 B2 | 7/2011 | Souda | |
| 8,319,674 B2 * | 11/2012 | Loeda et al. | 341/143 |
| 2007/0008200 A1 | 1/2007 | Hsieh et al. | |
| 2007/0018867 A1 | 1/2007 | Uemori et al. | |
| 2007/0216557 A1 | 9/2007 | Ebner et al. | |
| 2008/0062026 A1 | 3/2008 | Melanson | |
| 2008/0100486 A1 | 5/2008 | Lin | |
| 2008/0143567 A1 | 6/2008 | Vadipour | |
| 2009/0224954 A1 | 9/2009 | Balachandran | |
| 2009/0325632 A1 | 12/2009 | Gambini et al. | |

(Continued)

OTHER PUBLICATIONS

Ranjbar et al., "A Robust STF 6mW CT ΔΣ Modulator with 76dB Dynamic Range and 5MHz Bandwidth", Custom Integrated Circuits Conference (CICC), 2010 IEEE, Sep. 19-22, 2010.

(Continued)

*Primary Examiner* — Lam T Mai
(74) *Attorney, Agent, or Firm* — Baker Botts LLP.

(57) ABSTRACT

A continuous time delta-sigma modulator is provided that includes an integrator stage including a plurality of integrators; a quantizer to receive an input signal from the integrator stage and output a quantizer signal; a global feedback path providing feedback from the quantizer to the integrator stage; a local feedback path connecting the quantizer and a preceding integrator of the integrator stage configured to compensate for delay attributed to the global feedback path; and a delay compensation circuit. The delay compensation circuit is configured to calculate a delay value based on sources of additional delay within a local feedback loop, and to supply the additional delay value to the quantizer to compensate for delay within the local feedback loop.

15 Claims, 8 Drawing Sheets

(56) References Cited

U.S. PATENT DOCUMENTS

| | | |
|---|---|---|
| 2010/0073208 A1 | 3/2010 | Karthaus et al. |
| 2010/0085230 A1 | 4/2010 | Son |
| 2010/0171643 A1 | 7/2010 | Hong |
| 2010/0219998 A1 | 9/2010 | Oliaei |
| 2010/0219999 A1 | 9/2010 | Oliaei et al. |
| 2010/0259431 A1 | 10/2010 | Yu et al. |
| 2010/0328125 A1 | 12/2010 | Pagnanelli |
| 2011/0095927 A1 | 4/2011 | Pagnanelli |
| 2011/0133968 A1 | 6/2011 | Lin et al. |
| 2011/0140942 A1 | 6/2011 | Pagnanelli |
| 2011/0187571 A1 | 8/2011 | Lin et al. |
| 2011/0199247 A1 | 8/2011 | van Veldhoven et al. |
| 2012/0062405 A1 | 3/2012 | Loeda et al. |

OTHER PUBLICATIONS

Ranjbar et al., "A Multibit Dual-Feedback CT ΔΣ Modulator With Lowpass Signal Transfer Function", IEEE Transactions on Circuits and Systems-I: Regular Papers, vol. 58, No. 9, Sep. 2011.

* cited by examiner

DELAY COMPENSATION FOR SIGMA DELTA MODULATOR

FIELD

The embodiments discussed herein are related to sigma delta modulators. In particular, embodiments are related to delay compensation for sigma delta modulators to address delay present within a local feedback loop.

BACKGROUND

Continuous-time delta-sigma modulators continue to be researched and are included in various communication products. One variable affecting performance of a delta-sigma modulator is delay. As such various techniques continue to be developed to improve delay compensation within delta-sigma modulators.

An example of a known delay compensation technique applicable to a delta-sigma modulator is described in the article titled "A Robust STF 6 mW CT ΔΣ Modulator with 76 dB Dynamic Range and 5 MHz Bandwidth" by Ranjbar et al., which appears in the Custom Integrated Circuits Conference (CICC), 2010 IEEE conducted on Sep. 19-22, 2010. The article describes that providing a direct feedback path (i.e., local feedback path) between a last integrator stage and quantizer represents a classical solution for compensation of excess loop delay within a continuous-time delta-sigma modulator. In addition, the article describes compensating for delay of a preamplifier within a quantizer that would contribute to delay of the local feedback loop by providing a delay replica signal to a latch signal of a comparator within the quantizer.

However, as communication products and techniques continue to develop, improved delay compensation techniques are desired and/or required.

SUMMARY

According to one aspect of the embodiments, a method for delay compensation that is implemented in a continuous time delta-sigma modulator having a global feedback loop and a local feedback loop is provided. The method includes identifying sources of delay within the local feedback loop; calculating an additional delay element based on the identified sources of delay within the local feedback loop; and supplying the additional delay element to a quantizer to compensate for the sources of delay within the local feedback loop. The local feedback loop compensates for delay attributed to the global feedback loop that provides for the stability and frequency shaping control of an output signal. The sources of delay within the local feedback loop include at least two of dither delay, quantizer delay and input delay.

According to another aspect of the embodiments, a continuous time delta-sigma modulator is provided. The continuous time delta-sigma modulator includes: an integrator stage including a plurality of integrators; a quantizer configured to receive an input signal from the integrator stage and output a quantizer signal; a global feedback path providing feedback from the quantizer to the integrator stage; a local feedback path connecting the quantizer and a preceding integrator of the integrator stage configured to compensate for delay attributed to the global feedback path; and a delay compensation circuit configured to calculate a delay value based on sources of additional delay within a local feedback loop that includes the local feedback path, and to supply the additional delay value to the quantizer to compensate for at least two of dither delay, quantizer delay and input delay within the local feedback loop.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
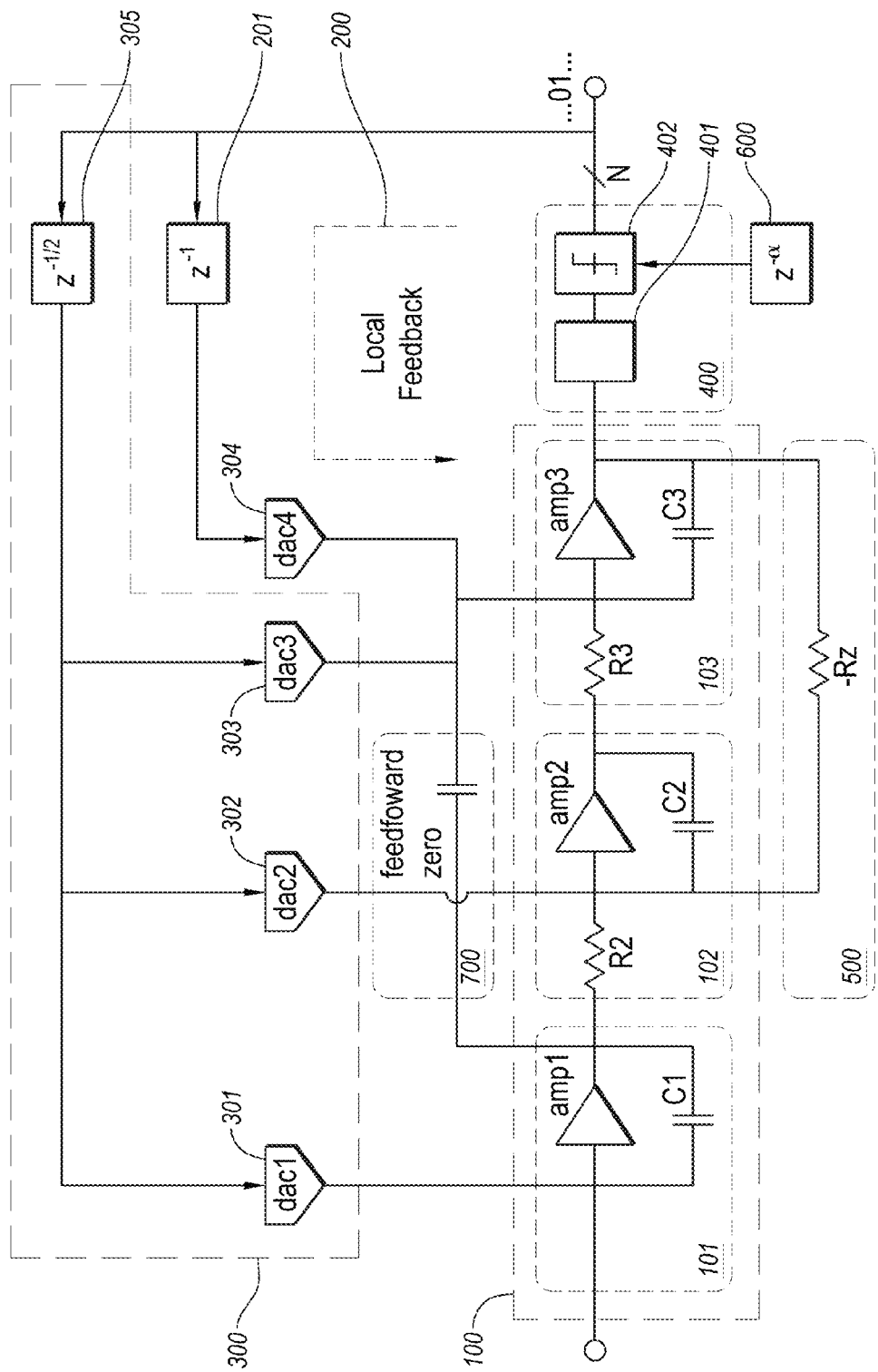
FIG. 1 is a diagram illustrating an example of a sigma delta modulator.

FIG. 1. illustrates an example of a delta-sigma modulator 1. The delta-sigma modulator includes an integrator stage 100. The integrator stage includes one or more integrators and amplifiers arranged to provide adequate signal and noise shaping to achieve the desired signal sensitivity for the application. For example, integrator stage 100 shown in FIG. 1 is that of a third order delta-sigma modulator. The third order system was chosen merely as an example and the techniques described here are applicable to other order systems. The integrator stage 100 of the third order system of FIG. 1 includes a first integrator 101 that includes an amplifier amp1 and capacitor C1; a second integrator 102 that includes a resistor R2, amplifier amp2 and capacitor C2; and a third integrator 103 that includes a resistor R3, capacitor C3 and amplifier amp3.

The delta-sigma modulator 1 also includes a number of feedback paths. The number of feedback paths is one or more and may equal the number of integrator stages. The feedback paths corresponding to the number of integrator stages are referred to herein as the global feedback path. For example, in FIG. 1, the global feedback path 300 includes $z^{-1/2}$ half cycle delay 305 (i.e., a half cycle delay in a clock with a 50% duty cycle) and three digital to analog converters (dac1, dac2, and dac3). The global feedback path operates to provide negative feedback to the integrator stage 100, and is integral in maintaining stability and proper frequency shaping control of the loop.

In FIG. 1, the delta-sigma modulator 1 includes a feed-forward zero 700 to provide targeted signal transfer function (STF) frequency notching to reduce un-desired blockers (such as TX duplexer leakage or adjacent channel signals, for example). Stated differently, the feed-forward zero 700 places a notch in the STF to block signals at the notch frequency.

The resonator 500 of the delta-sigma modulator 1 is provided to optimize the noise transfer function (NTF) by modulating a zero off of DC to a more optimal frequency, allowing improved SNR or sensitivity of the modulator. Stated differently, the resonator 500 places a notch in the NTF to block quantization noise contribution at the notch frequency.

Each of the components above may contribute to delay within the delta-sigma modulator system. As noted in the background of this application adding a local or direct feedback loop between a last integrator stage and quantizer represents a classical solution for compensation of excess loop delay within a continuous-time delta-sigma modulator. However, embodiments herein are focused on previously uncompensated for delay within delta-sigma modulators. For example, embodiments herein are focused on delay within the local feedback loop as further explained below.

As illustrated in the delta-sigma modulator 1, a local feedback path 200 is included to provide feedback from the output of the quantizer 400 to the immediately preceding third integrator 103. The local feedback path includes $z^{-1}$ unit delay 201 (i.e., a full clock cycle delay) and a digital to analog converter dac4. Herein, the local feedback path 200, the quantizer 400 and the third integrator 103 are collectively referred to as the local feedback loop. The inventors of this application researched and recognized an issue not previously known in the art (i.e., identified previously unexpected results relating to an implementation of a local feedback loop). As noted in the background section of this application, it is desirable to increase operation speeds of the delta-sigma modulator. However, the inventors recognized that as the clock speed increases, delay within the local feedback loop becomes a hurdle that must be addressed. As the clock period decreases, the percentage of the clock period consumed by the delay becomes larger absent an improved delay compensation technique. As such, the inventors recognized a new and/or improved method for delay compensation in which compensation is provided for delay within the local feedback loop.

Figure 2:
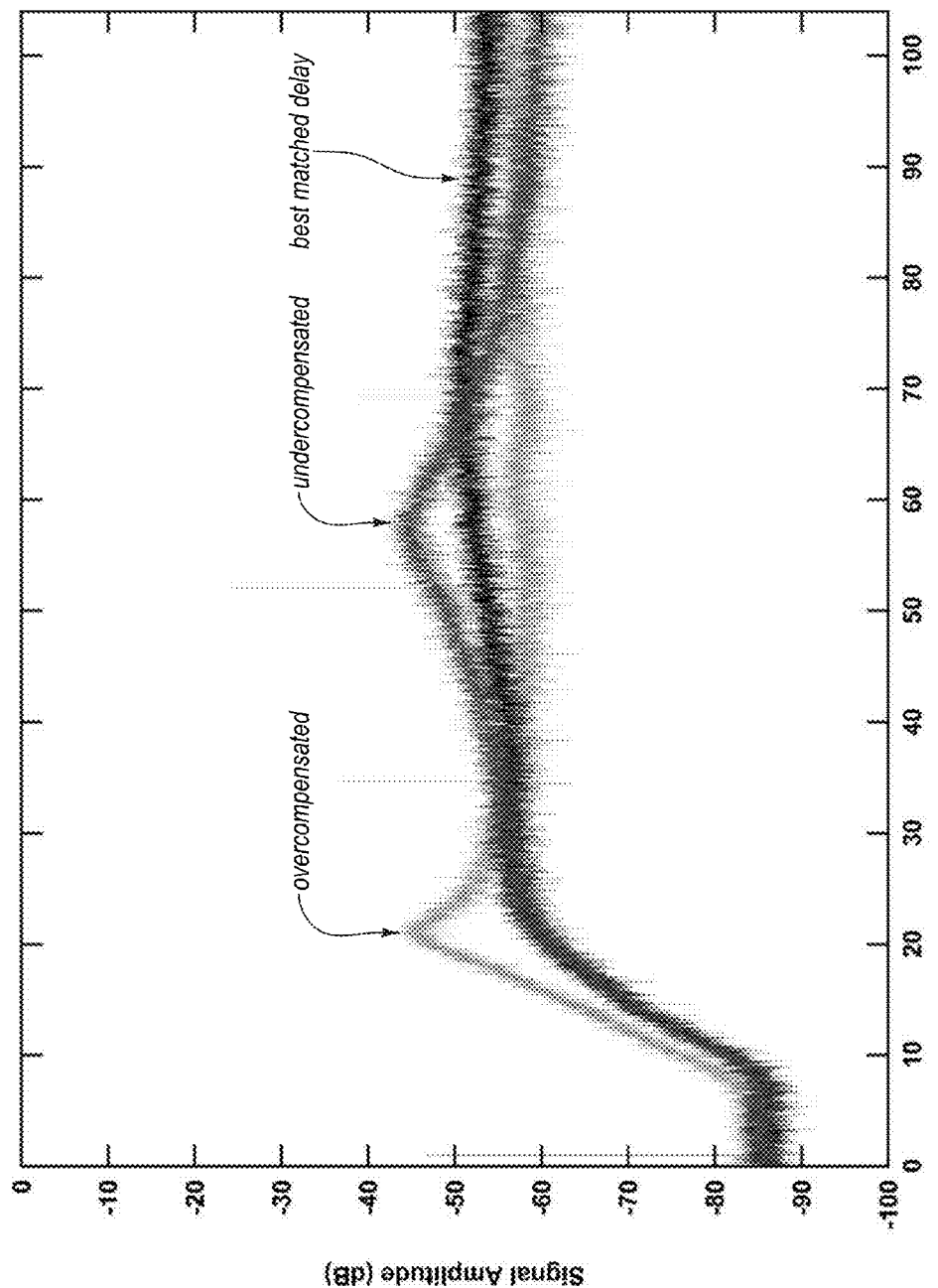
FIG. 2 illustrates an example of data relating to a delta sigma modulator.

FIG. 2 is an example of data provided by the inventors demonstrating the unexpected results and importance of the delay compensation techniques described herein.

FIG. 2 illustrates an example of data relating to the delta sigma modulator 1. In particular, FIG. 2 illustrates a Fast Fourier Transform (FFT) graph of signal amplitude (dB) versus frequency measurements when various different digital delay settings are provided for the delta sigma modulator 1.

An idealized version of FIG. 2 would illustrate a notch at DC, with the spectrum then rising to a flat plateau without peaking behavior. The graph in FIG. 2 illustrates what occurs when delay is undercompensated, compensated for appropriately, and overcompensated. The undercompensated data set does not provide a sufficient plateau portion. The overcompensated data set results in a prominent peak around 20 MHz and other sharper peaks throughout the plateau portion. Both the undercompensated data set and overcompensated data set would result in degradation of the signal likely to cause operation issues within the delta sigma modulator 1. The best matched data set in FIG. 2 is the data set that is compensated for most appropriately.

In view of the foregoing, example embodiments of delay compensation techniques provide a delay compensation technique in which an additional delay compensation element 600 is provided to the quantizer as shown in FIG. 1. The additional delay compensation element 600 is $z^{-alpha}$, and some of the details of $z^{-alpha}$ are explained below with respect to simulation data in FIG. 3.

Figure 3:
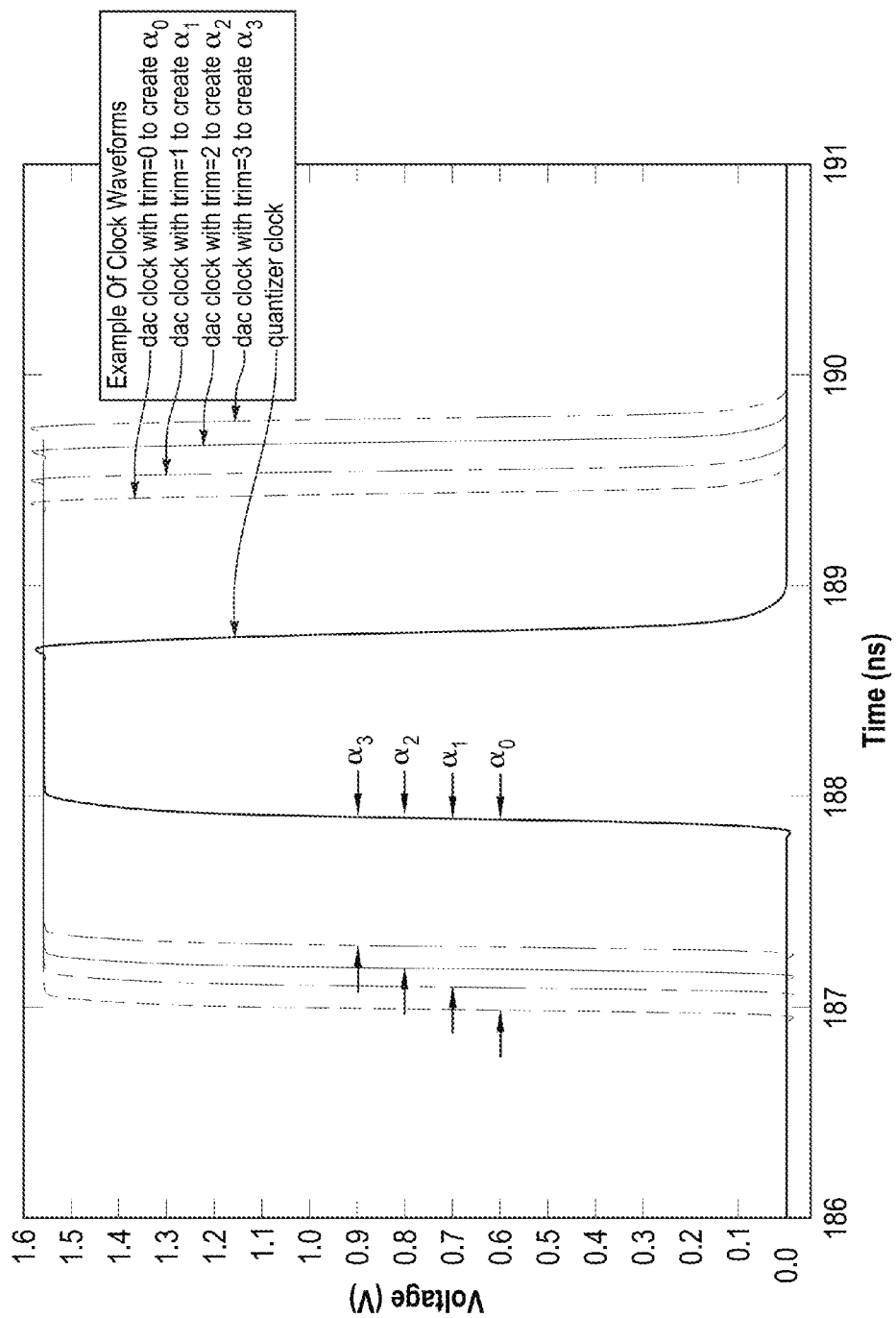
FIG. 3 illustrates an example of a simulation relating to a delta sigma modulator.
Figure 4:
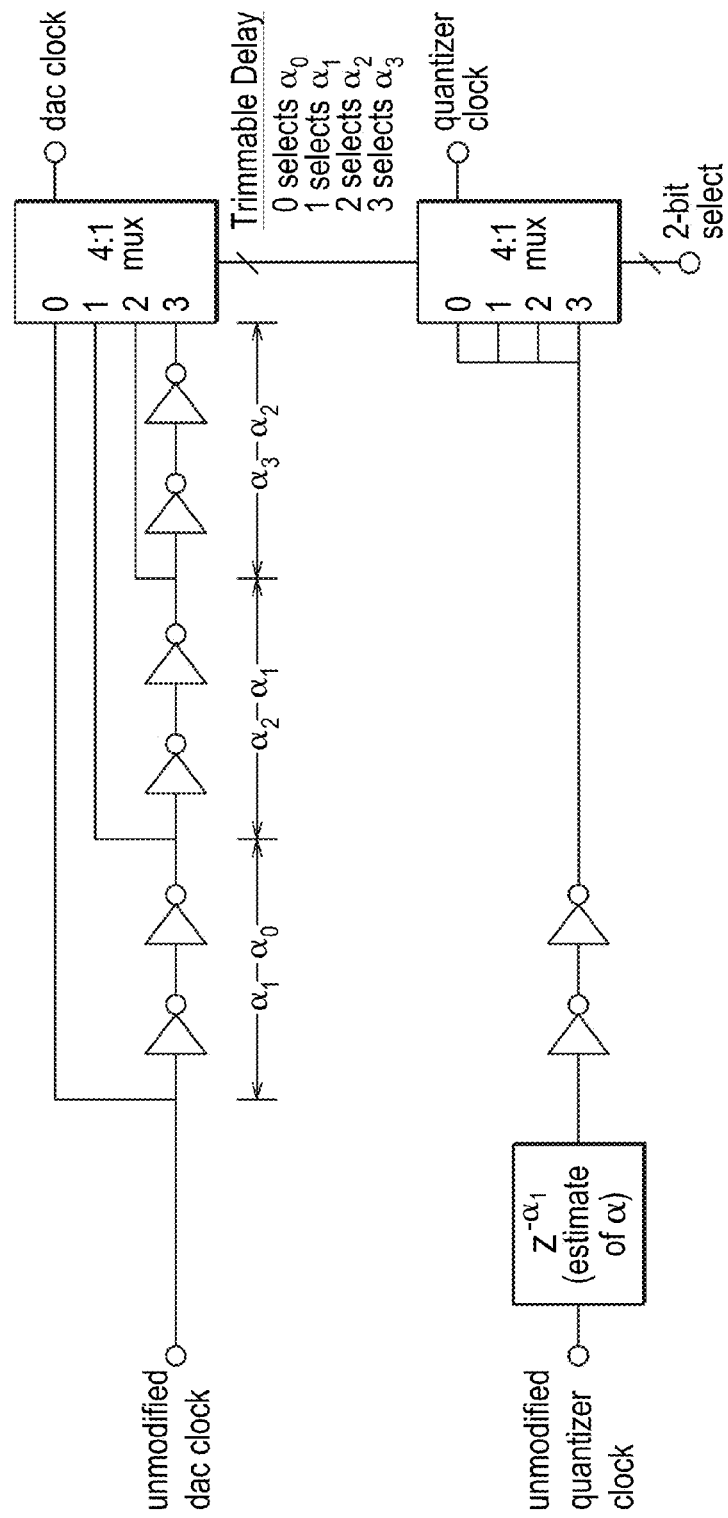
FIG. 4 illustrates an example circuit diagram of a delay compensation circuit for providing delay compensation.

FIG. 3 illustrates an example of a simulation relating to a delta sigma modulator. FIG. 4 illustrates example circuit diagrams relating to the additional delay compensation element 600 and how the alpha values within the data simulation of 3 may be generated. An estimate of alpha may be obtained from a circuit simulator or be an iteration from measurements of previous circuit designs, for example. An example circuit to implement such a delay can be constructed from an appropriate number of inverters coupled in series, or by a replica circuit of the block whose delay is to be modeled (e.g. preamplifier), or by a combination of the two (e.g. an inverter series whose delay matches the integrator excess delay, further coupled with a replica preamplifier). The output may further be coupled to an inverter/mux combination as shown in FIG. 4 to generate trimmable versions of the estimated delay (e.g., alpha° has less delay, alpha1 has the delay as estimated, alpha2 has more delay, alpha3 has even more delay). The data in FIG. 3 and circuit diagrams in FIG. 4 illustrate an example how a delay can be provided to a clock of the quantizer in order to provide the desired timing between the quantizer and all of the clocks of the delta sigma modulator system according to an example embodiment.

Referring back to FIG. 1, the additional delay compensation is element 600, and $z^{-alpha}$ is provided to the quantizer 400. The quantizer 400 receives an input from the third integrator 103. The output of the quantizer 400 is fed back to the third integrator 103. The local feedback path connecting the quantizer 400 and the third integrator includes the $z^{-1}$ unit delay 201 and a digital to analog converter dac4. As further described below, example embodiments focus on compensating for delay stemming from the quantizer components, the integrator components, the local feedback path components and connections therebetween (i.e., the local feedback loop). The quantizer components, integrator components and local feedback path components and connections therebetween are herein collectively referred to as the local feedback loop.

The delays can include a static component (i.e. a delay representive of typical conditions such as process, voltage and temperature), as well as a dynamic component that can change with any of these parameters. Further, the delays may represent delays associated with not having ideal components (e.g., components with finite op-amp bandwidths, parasitic poles of passive devices and interconnect parasitic poles.) Also, parasitic resistances and parasitic capacitances associated with metal interconnects contribute to delay. The delay compensation element 600, can be configured to dynamically adjust for any one of these parameters, as well as purposeful design influences, such as quantizer 401 delay or amplifier 103 delay due to reduced current drain requirements, for example.

The quantizer 400 shown in FIG. 1 includes various components, 401 in addition the internal comparator 402 of the quantizer 400.

Figure 5:
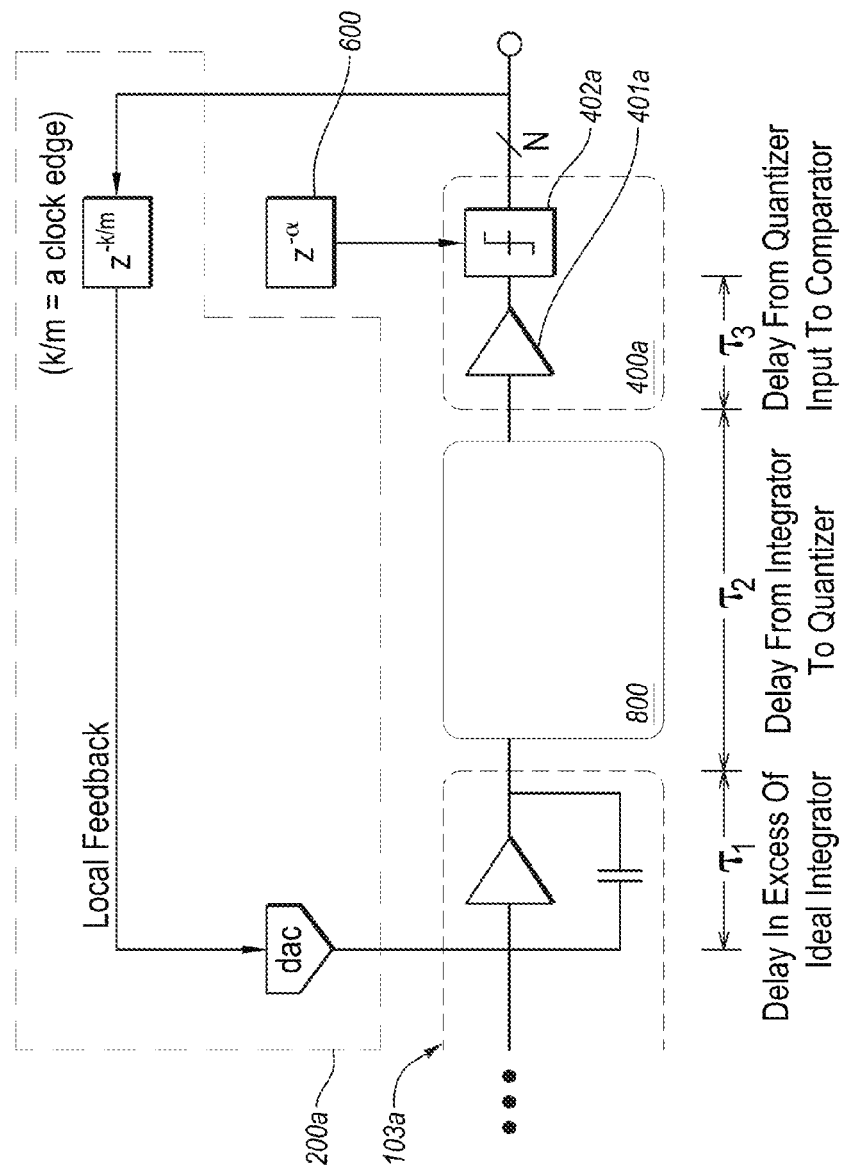
FIG. 5 illustrates an example embodiment compensating for delay within the local feedback loop.

FIG. 5 illustrates an example embodiment in which the various components 401 of the quantizer 400 of FIG. 1 is a preamplifier 401a. Accordingly, the quantizer 400 includes the preamplifier 401a and the internal comparator 402. FIG. 5 illustrates an example embodiment in which delays within the local feedback loop are identified and compensated for using the additional delay compensation element 600. In particular, FIG. 5 illustrates the integrator 103a having delay herein referred to as input delay t1. FIG. 5 also illustrates a dither block 800 between the integrator 103a and the quantizer 400a. The dither block 800 also has delay referred to herein as dither delay t2 that is dither delay associated with the series dither resistor load. Also, feedback delay t3 shown in FIG. 5 is delay associated with components of the quantizer 400a and local feedback path 200. An example embodiment calculates an appropriate alpha to compensate for the delay using equation (1) below.

$$\text{alpha} = f(t1+t2+t3) \quad (1)$$

For example, the local feedback delay t3 shown in FIG. 5 includes delay associated with the pre-amplifier 401a and the other local feedback path components 200a e.g., the $z^{-k/m}$ local feedback delay element 201a and the digital to analog converter dac. (It is noted that the $z^{-k/m}$ represents a generalized clock edge. For example, if a clock is provided at 2× the existing frequency, then every exponent is doubled. Similarly, a clock with a 25% duty cycle would be represented by have k=1 and m=4.) Equation 1 above illustrates that alpha is a function of input delay t1, dither delay t2 and local feedback delay t3.

An example of data associated with the delta sigma modulator 1 is now provided to further explain the significance of an example embodiment of the delay compensation technique. The input delay t1 in this example is due to input loading from a feedforward capacitor array and is assumed to be equal to 434 ps. The dither delay t2 in this example is due to a series dither resistor load and equal to 81 ps. Lastly, a local feedback delay t3 in this example is delay of a preamplifier within the quantizer and is 353 ps. According to this example, t1>t3 (i.e, 434 ps>353 ps) and thus, providing a delay compensation technique for only t3 would be insufficient. Assuming a total of about 2404 ps is allotted for quantizer operations of the delta sigma modulator 1, not providing a delay compensation technique in which the local feedback delay t3 of 434 ps, dither delay t2 of 81 ps, and input delay t1 of 434 ps would be detrimental to the operations of the delta-sigma modulator 1. Accordingly, this example embodiment considers each of t1, t2 and t3 when providing the additional delay compensation element 600 of $z^{-alpha}$ to the quantizer 400a.

Figure 6:
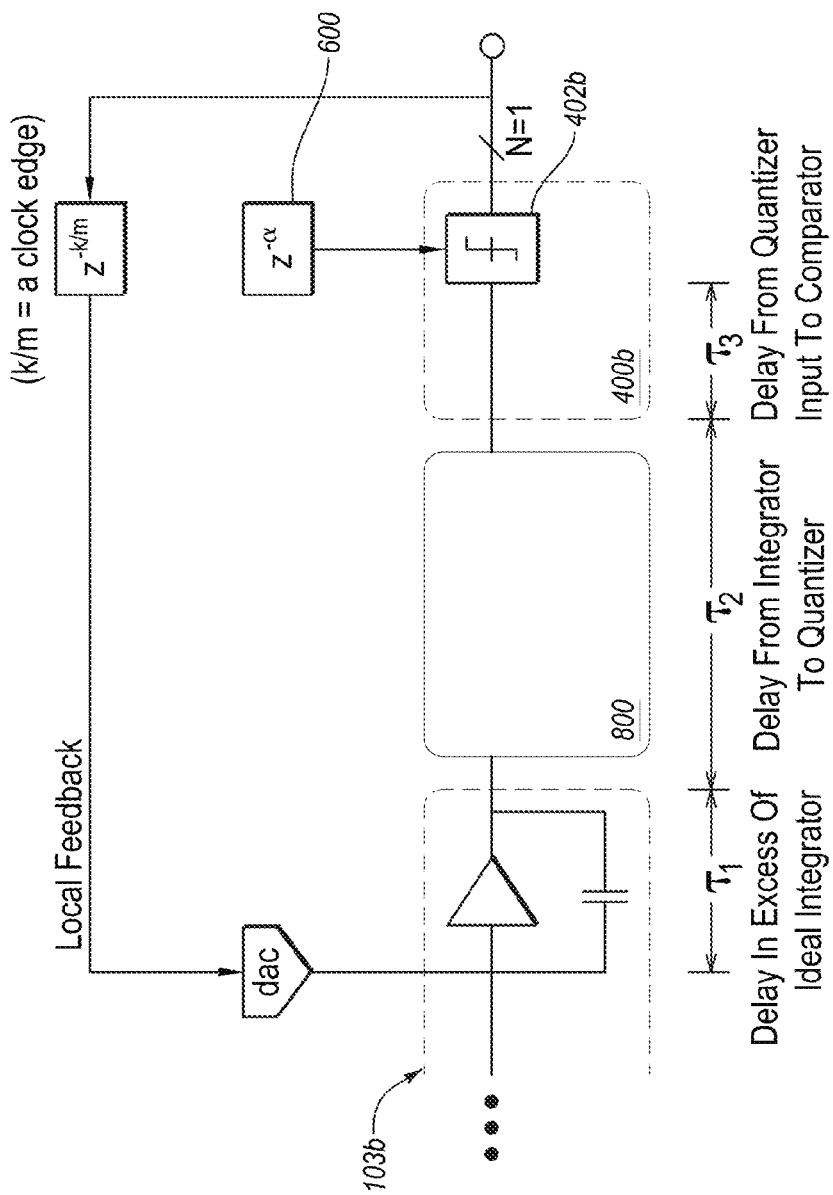
FIG. 6 illustrates another example embodiment compensating for delay within the local feedback loop.

FIG. 6 illustrates an example embodiment in which there are no significant delay contributing components 401 of the quantizer 400 between the input to the quantizer 400b and the internal comparator 402b of the quantizer 400b. Accordingly, in this instance the local feedback t3 delay would be approximately zero (i.e., does not significantly affect operations of the delta-sigma modulator. However, the additional delay compensation element 600 of $z^{-alpha}$ is still calculated and provided to the quantizer in order to compensate for both the input delay t1 of the integrator 103b and the dither delay t2 associated with dither block 800. Conventional art techniques such as those described in the background section would not set $z^{-alpha}$ according to a function of all delay within the local feedback loop and input $z^{-alpha}$ into the quantizer for delay compensation. Accordingly, a conventional art technique would not address the input delay t1 (e.g., integrator delay in this example) and the dither delay t2 within the local feedback loop.

Figure 7:
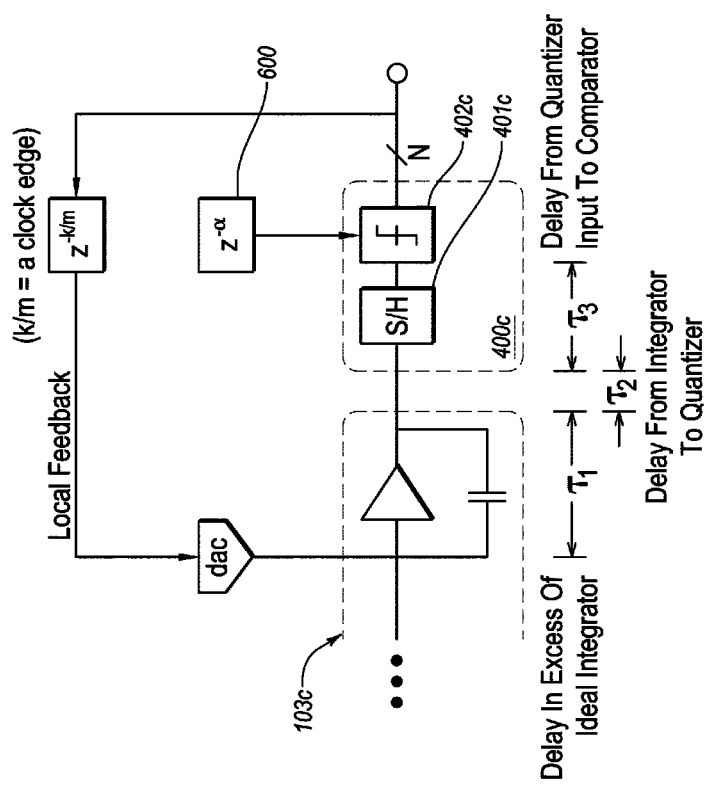
FIG. 7 illustrates yet another example embodiment compensating for delay within the local feedback loop.

FIG. 7 illustrates an example embodiment in which the various components 401 of the quantizer 400 of FIG. 1 is a sample and hold circuit 401c. As noted above, example embodiments must compensate for elements within the local feedback loop. For example, the local feedback delay t3 shown in FIG. 8 includes delay associated with the sample and hold circuit 401c and the other local feedback loop components (e.g., the $z^{-k/m}$ local feedback delay element 201c and the digital to analog converter 204c).

Figure 8:
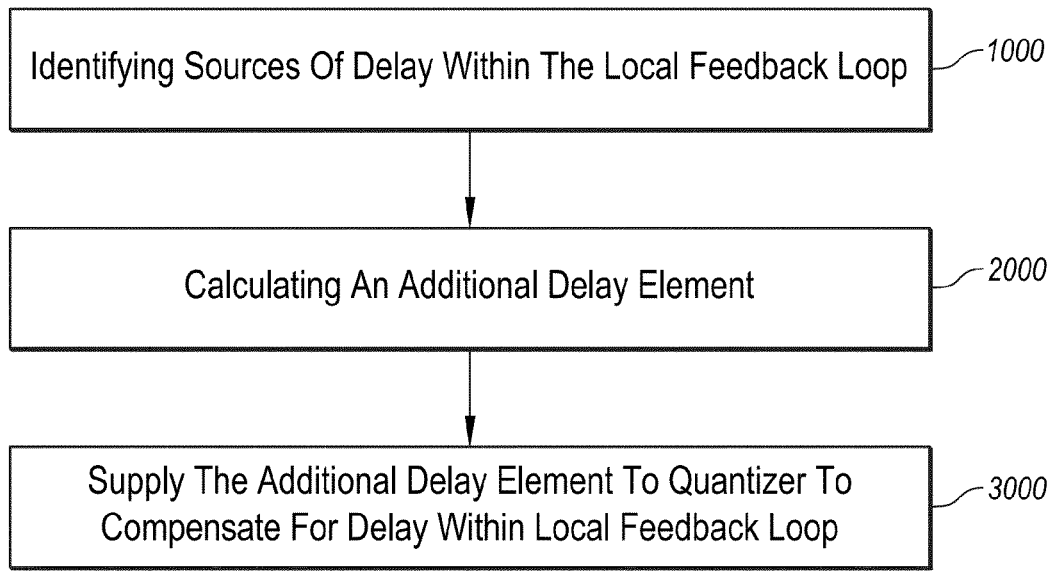
FIG. 8 is a flowchart illustrating an example embodiment of a method for delay compensation within a delta-sigma modulator.

FIG. 8 illustrates an example embodiment of a method for delay compensation implemented in a continuous time delta-sigma modulator having a global feedback loop and a local feedback loop. The example method shown in FIG. 8, includes identifying sources of delay within the local feedback loop (1000). As previously discussed, the sources of delay may be delay from the quantizer components, integrator components, local feedback path components and/or connections therebetween. The method further includes calculating an additional delay element based on the identified sources of delay within the local feedback loop (2000). For example, alpha may be calculated according to equation 1 as previously described. The method of FIG. 8 further includes supplying the additional delay element to a quantizer to compensate for the sources of delay within the local feedback loop (3000). For example, the calculated alpha value may be generated by a delay compensation circuit such as the circuit illustrated in FIG. 3 and supplied to a clock of the quantizer in order to provide the desired timing between the quantizer and all of the clocks of the delta sigma modulator system.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

The invention claimed is:

1. A method for delay compensation implemented in a continuous time delta-sigma modulator having a global feedback loop and a local feedback loop, the method comprising:
   identifying sources of delay within the local feedback loop, the local feedback loop compensating for delay attributed to the global feedback loop that provides for the stability and frequency shaping control of an output signal;
   calculating an additional delay element based on the identified sources of delay within the local feedback loop; and
   supplying the additional delay element to a quantizer to compensate for the sources of delay within the local feedback loop, the sources of delay including at least two of dither delay, quantizer delay and input delay.

2. The method according to claim 1, wherein the input delay is integrator delay of the integrator connected to the quantizer via a local feedback path.

3. The method according to claim 2, wherein the quantizer includes a preamplifier and a comparator, and the quantizer delay is delay associated with the preamplifier.

4. The method according to claim 2, wherein the quantizer includes a sample and hold circuit and the quantizer delay is delay associated with the sample/hold setup time of the sample and hold circuit.

5. The method according to claim 1, wherein the additional delay is a sum of the identified sources of delay within the local feedback loop.

6. The method according to claim 1, wherein the local feedback path includes a digital to analog converter and a delay with a length is a time between two clock edges.

7. The method according to claim 1, wherein the additional delay element is supplied to the quantizer to control timing between a quantizer clock and other clocks of the delta-sigma modulator.

8. A continuous time delta-sigma modulator comprising:
   an integrator stage including a plurality of integrators;

a quantizer configured to receive an input signal from the integrator stage and output a quantizer signal;

a global feedback path providing feedback from the quantizer to the integrator stage;

a local feedback path connecting the quantizer and a preceding integrator of the integrator stage configured to compensate for delay attributed to the global feedback path; and a delay compensation circuit configured to calculate a delay value based on sources of additional delay within a local feedback loop that includes the local feedback path, and to supply the additional delay value to the quantizer to compensate for at least two of dither delay, quantizer delay and input delay within the local feedback loop.

9. The continuous time delta-sigma modulator according to claim 8, wherein the delay compensation circuit includes at least one of a plurality of inverters and a replica circuit of a component of the local feedback loop.

10. The continuous time delta-sigma modulator according to claim 9, wherein the delay compensation circuit is configured to provide multiple delay values that are trimmable to compensate for the at least two of the dither delay, the quantizer delay and the input delay within the local feedback loop.

11. The continuous time delta-sigma modulator according to claim 8, wherein the local feedback loop includes the local feedback path, an integrator of the integrator stage providing the input signal to the quantizer, and the quantizer.

12. The continuous time delta-sigma modulator according to claim 11, wherein the calculated delay value is associated with the input delay attributed to the integrator of the integrator stage providing the input signal.

13. The continuous time delta-sigma modulator according to claim 11, wherein the quantizer includes a preamplifier and a comparator and the quantizer delay is delay associated with the preamplifier.

14. The continuous time delta-sigma modulator according to claim 11, wherein the quantizer includes a sample and hold circuit and the quantizer delay is delay associated with the sample/hold setup time of the sample and hold circuit.

15. The continuous time delta-sigma modulator according to claim 11, wherein the calculated delay value is supplied to the quantizer to control timing between a quantizer clock and other clocks of the delta-sigma modulator.

* * * * *